United States Patent
Wang et al.

(10) Patent No.: US 6,774,026 B1
(45) Date of Patent: Aug. 10, 2004

(54) STRUCTURE AND METHOD FOR LOW-STRESS CONCENTRATION SOLDER BUMPS

(75) Inventors: Chung Yu Wang, Jung-he (TW); Chender Huang, Hsin-chu (TW); Pei Haw Tsao, Taichung (TW); Ken Chen, Hsinchu (TW); Hank Huang, Jungli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/177,912

(22) Filed: Jun. 20, 2002

(51) Int. Cl.[7] ............................................. H01L 21/44

(52) U.S. Cl. ........................ 438/612; 438/613; 438/614

(58) Field of Search .................................. 438/612–614

(56) References Cited

U.S. PATENT DOCUMENTS

| | | | |
|---|---|---|---|
| 6,142,361 A | 11/2000 | Downes, Jr. et al. | .... 228/173.1 |
| 6,146,984 A | 11/2000 | Leibovitz et al. | ............ 438/613 |
| 6,156,635 A | 12/2000 | Mizuta | ........................ 438/612 |
| 6,211,052 B1 | 4/2001 | Farnworth | ................... 438/614 |
| 6,222,279 B1 | 4/2001 | Mis et al. | .................... 257/779 |
| 6,228,681 B1 * | 5/2001 | Gilleo et al. | ................. 438/612 |
| 2002/0185733 A1 * | 12/2002 | Chow et al. | ................. 438/612 |

* cited by examiner

*Primary Examiner*—Lynne Gurley

(57) ABSTRACT

Low stress concentration solder bumps are created on a semiconductor wafer by the removal of metal oxides of under bump metallurgy, (UBM). The removal of the oxides from the circular edge of the UBM allow the solder of the solder bump to wet the sides of the UBM, mainly the plated portion, thereby resulting in a solder bump structure with a filled undercut. This results in a lower stress concentration solder bump structure. This solder bump structure is obtained after the solder bumps have been reflowed on the wafer.

8 Claims, 1 Drawing Sheet

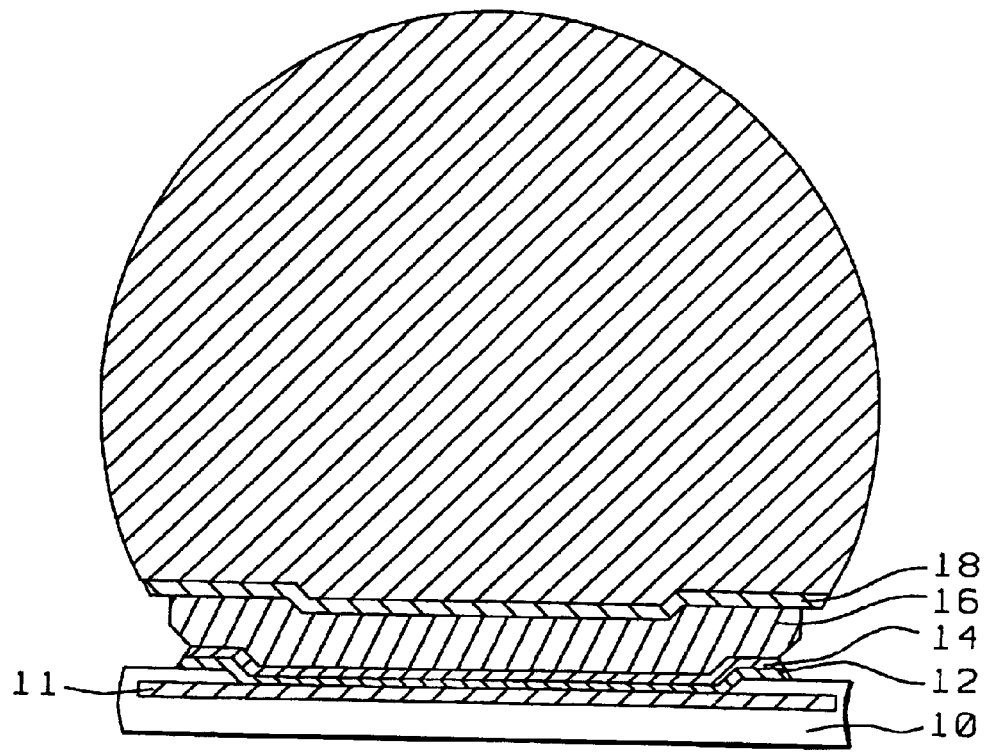
FIG. 1 - Prior Art
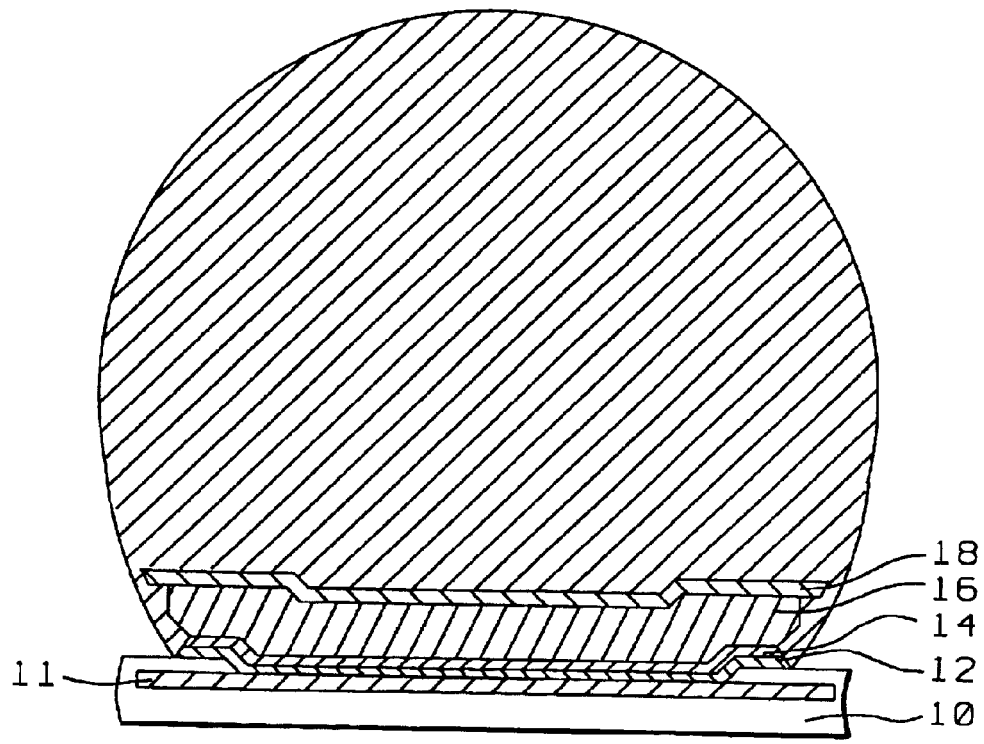
FIG. 2

STRUCTURE AND METHOD FOR LOW-STRESS CONCENTRATION SOLDER BUMPS

BACKGROUND OF THE INVENTION (1) Technical Field

This invention relates in general to structure and shape of solder bumps used in the interconnection of integrated solders. In addition to the process of obtaining the desired structure for enhanced interconnection reliability.

(2) Description of Prior Art

The following four U.S. patents relate to solder bump structures or methods of fabrication.

U.S. Pat. No. 6,156,635 issued Dec. 5, 2000, to Masaharu Mizuta disclosed a method for correcting solder bumps.

U.S. Pat. No. 6,146,984 issued Nov. 14, 2000, to Jacques Leibovitz et. al., discloses a method for obtaining uniform height solder bumps.

U.S. Pat. No. 6,142,361 issued Nov. 7, 2000, to Francis J. Downes et. al., discloses a solder bump assembly method using magnetic force and adhesives.

U.S. Pat. No. 6,211,052B1 issued Apr. 3, 2001, to Warren M. Farnworth discloses a mask pattern process for forming UBM pads and solder bumps.

The advent of VLSI technology in the semiconductor field has created the need for higher interconnection density on the surface of the semiconductor chip or die. These interconnections are used to connect the chip terminals to the next level of package or circuit board. The need for higher density interconnections results from the smaller circuit devices results in higher circuit count per chip. The higher circuit count requires more signal input, and signal output connections. In addition, the higher circuit count requires more power to be delivered to the chip or die requiring more power connections. The need for higher interconnection density has resulted in interconnection techniques such as solder bumps that are capable of utilizing the total area of the chip, thus providing more interconnections per chip. The wire bonding technology which is also used for chip interconnections mainly utilizes the periphery of the chip and is limited to the number of interconnections it can provide for a comparable size chip.

The long term reliability of interconnections is an important aspect of the interconnection technology. The design and method of manufacturing the solder bumps dictates the structure of the solder bumps and their inherent long term reliability.

Solder bumps are created on the semiconductor chips or dies at the semiconductor wafer level prior to dicing into chips or dies. After the circuits are formed on the wafer and insulating oxide layers are deposited, FIG. 1 10, contact holes to the circuit metallurgy are etched in the insulating layer utilizing photo lithographic techniques. Metallization layers are then created to provide contact to the circuits and allow for the fabrication of solder bumps at the appropriate spots. The metal layers that are deposited usually are referred to as, "under ball metallurgy", or UBM consist of the following:

A layer of metal 12 that adheres to the circuit metal and the insulating oxide, usually a thin layer 0.1~0.2 um thickness of titanium (Ti).

A layer of sputtered copper, (Cu) 14.

A layer of plated copper 16, usually 4~8 um thick, that forms a protective barrier against contamination of the base metallurgy.

Finally, a layer of plated nickel, (Ni) 18, is deposited to allow for adhesion or wetting of the solder, usually a lead tin, (Pb—Sn), alloy.

The lead-tin solder is deposited by plating through holes in a photoresist layer that has been patterned to have openings, circular holes, over the desired contact area. After the photoresist is removed the UBM is etched using the plated solder as a mask. The etching process is performed in several steps. First, the nickel layer is etched, then the thick copper layer, and finally the adhesive titanium layer. In etching the copper layer 16, an undercut results as shown. Due to its thickness, the copper needs to be exposed to the etchant for a longer period resulting in an undercut. The undercut is detrimental to the long term reliability of the interconnection but is an inherent result of the etching process. After a solder reflow step that utilizes flux the resultant structure shown in FIG. 1 is achieved.

Samples of the finished wafers and/or chips are tested for mechanical integrity of the solder bumps by the use of bump shear or die shear tests. These tests have been correlated with long term reliability testing, i.e., thermal cycling to indicate levels of reliability. The main indicator is the location of the bump failure at the shear tests. An acceptable result is when the shear tests result in the majority of the failures in the bulk solder and not at the chip interface.

SUMMARY OF THE INVENTION

The objective of the invention is to provide a solder bump comprised of a structure that has a low stress concentration profile.

A further objective of the invention is to provide a method for obtaining a low stress concentration solder ball structure.

Another objective of the invention is to provide a method for obtaining oxide free UBM edges.

An additional objective of the invention is to provide a method wherein the solder of the solder bump contacts the circular edge of the UBM.

In addition, an objective of the present invention is to provide a method to allow the solder of a solder bump to completely fill the undercut of the UBM.

The above objectives are achieved by the present invention by providing a solder bump structure that has a profile free of any discontinuities which would cause high stress concentration factors. One of the main discontinuities that exist in solder bump technology is the resultant undercut of the thick copper layer in the UBM due to the etching process. The present invention achieves a structure that allows the solder of the solder bump to fully cover the sides of the UBM as shown in FIG. 2. FIG. 2 shows that the undercut has been filled in by the solder and provides a low stress solder bump.

The low stress shown in FIG. 2 is achieved by a solder bump reflow process utilizing a rosin type flux to the wafer by spin coating. The wafer is then placed in a reflow oven where the action of the flux removes any oxides present on the edges of the UBM and allows the solder bump to wet the circular edge and flow to the surface of the wafer.

DESCRIPTION OF THE DRAWINGS

FIG. 1 is a cross section of a typical solder bump of the prior art.

FIG. 2 is a cross section of the low stress solder bump of the present invention.

DETAILED DESCRIPTION OF THE PREFERRED EMBODIMENT

In order to meet the demands for the higher number of interconnections on advanced semiconductor chips or dies an interconnection technology is required that can provide high interconnection density. Solder bump technology has shown that it can provide the high interconnection density by allowing for close spacing of the interconnections as well as utilizing the total area of the semiconductor chip or die.

The solder bump technology used in the present invention utilizes lead-tin solder 5% tin Sn 95% lead Pb, or 63% Sn and 37% Pb depending on the product application. The lead-tin alloy is evaporated through a metal mask onto the semiconductor wafer that has semiconductor circuits, a passivation layer, and the under bump metallurgy or UBM deposited on it. The solder bumps are then reflowed in an inert, Nitrogen (N2) atmosphere at 360 degrees C for 45–90 seconds. During the reflow process the solder alloy forms semicircular spheres on the surface of the wafer. This phenomenon is due to the surface tension of the molten solder alloy.

The interconnecting of integrated circuit chips or dies to the next level of package has utilized a technology referred to as solder bumps. This technology provides the necessary interconnection density required by the high demand for input, output, and power connections to service the high circuit count in today's integrated circuits. The solder bump structure is formed at the wafer level after the circuits and insulation layers are formed on the wafer.

Solder bump technology utilizes lead-tin (Pb/Sn) solder reflowed into a sphere that interconnects the circuit terminals of the circuits to the surface of the chip or die. The solder bumps are then utilized to interconnect the chip or die terminals to the next level of package or circuit board. Inherent in the solder bump technology is the ability to place the solder bumps on tight spacing as well as to utilize the total area of the semiconductor chip or die. This allows for a much larger number of interconnections per semiconductor chip or die.

Electronic products that use semiconductor chips or dies are subjected to use conditions that involve shock, vibration, and thermal excursions. Thermal excursions or temperature changes are due to the product environment as well as to the power consumed by the product during the use condition These temperature changes result in physical expansion of components; i.e., the semiconductor chips or dies and the circuit boards that interconnect them. Due to the different rates or expansion, mechanical stresses result in the interconnecting elements. The solder bump technology, design, and method of fabrication need to have the mechanical integrity to withstand the long term effects of the temperature changes.

The process begins by the deposition of the "under bump metallurgy," UBM, on the wafer FIG. 1. The UBM deposition process consists of the following steps:

Contact holes 10 to the circuit metallurgy are etched in the insulating oxide layer by conventional lithographic techniques.

A metallurgy adhesion layer of titanium 12 (Ti) 0.1~0.2 um thickness is sputtered onto the wafer.

A layer of thin copper 14 (Cu) which acts as a transition layer is deposited on the wafer by sputtering.

A thick layer of copper 16 (Cu), 4~8 um used as a barrier layer, is electroplated onto the wafer.

A layer of nickel 18 (Ni), 3~6 um in thickness used for the wetting of the solder is electroplated on to the wafer.

After the blanket deposition of the UBM which covers the surface of the wafer, lead-tin (Pb—Sn) solder 20 is electroplated on to the wafer through a mask. The lead-tin solder composition maybe 5% Sn 95% PB or 63% Sn 37% Pb depending on the final usage of the semiconductor die. The mask is so patterned so as to allow the solder to be deposited over the circular contact hole area. The UBM is then selectively etched in the area not covered by the solder.

The etching process is performed in several steps. First the nickel layer is etched, then the thick copper layer, and finally the adhesive titanium layer. In etching the copper layer 16, an undercut results as shown. Due to its thickness, the copper needs to be exposed to the etchant for a longer period resulting in an undercut.

The present invention provides a solder bump structure that removes the high stress concentration that results from the etching of the copper and the resultant UBM undercut. This key feature of the invention is accomplished by using a rosin flux; for example, RMA as provided by Alpha Metal Corp. during the solder reflow process. This eliminates the metal oxides from the edge of the UBM and allows the solder to wet and flow into the undercut area. This is shown in FIG. 2.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of providing a low stress solder bump structure comprising a UBM layer and an overlaying solder bump; comprising the steps of:

applying a resin type flux to said solder bump structure; and reflowing the solder bump to contact and fill the edge of the UBM layer; wherein the reflow step utilizes resin flux to remove metal oxides from the edge of the UBM; the UBM layer includes copper and exposed copper sidewalls.

2. The method of claim 1 wherein said method is used to form an array of solder bumps on a semiconductor substrate wherein the UBM is devoid of metal oxides on the edges.

3. The method of claim 1 wherein said UBM layer has a first titanium layer formed by sputtering.

4. The method of claim 3 wherein said UBM layer has a second, thin copper layer, over said first Titanium layer, formed by sputtering.

5. The method of claim 4 wherein said UBM layer has a third thick copper layer 4–8 um, over said second copper layer, formed by plating.

6. The method of claim 5 wherein said UBM layer has a nickel layer over said thick copper layer deposited by plating.

7. The method of claim 1 wherein the solder reflow process allows the solder of the solder bump to fill an undercut of the UBM layer.

8. The method of claim 1 wherein the solder bump structure has a shape devoid of high stress concentration locations.

* * * * *